[11] 4,399,194
[45] Aug. 16, 1983

[54] TRANSPARENT CONDUCTIVE FILM

[75] Inventors: Joseph Zelez, Tannersville, Pa.; John L. Vossen, Jr., Bridgewater, N.J.

[73] Assignee: RCA Corporation, New York, N.Y.

[21] Appl. No.: 335,708

[22] Filed: Dec. 30, 1981

[51] Int. Cl.³ .................................................. B32B 15/04
[52] U.S. Cl. .................................. 428/457; 428/450; 428/469; 428/697; 428/701; 428/702
[58] Field of Search ................ 428/697, 702, 1, 433, 428/457, 450, 701, 469; 427/62, 87, 126.3

[56] References Cited

U.S. PATENT DOCUMENTS

| | | | |
|---|---|---|---|
| 4,260,222 | 4/1981 | Kozawa | 428/702 X |
| 4,275,103 | 6/1981 | Tsubusaki et al. | 428/697 |
| 4,336,277 | 6/1982 | Bunshah et al. | 427/126.3 X |
| 4,345,000 | 8/1982 | Kawazoe et al. | 428/697 X |
| 4,357,374 | 11/1982 | Ogawa | 428/1 |

*Primary Examiner*—Thomas J. Herbert, Jr.
*Attorney, Agent, or Firm*—Birgit E. Morris; R. Hain Swope

[57] ABSTRACT

Transparent conductive films of indium oxide and zirconium oxide, methodology for annealing them and an etchant therefor are disclosed.

2 Claims, No Drawings

TRANSPARENT CONDUCTIVE FILM

This invention relates to transparent conductive films having advantageous properties and their preparation.

BACKGROUND OF THE INVENTION

Transparent, conductive films have a wide variety of uses and have in recent years become increasingly important in the electronics industry. Such films are required for numerous devices such as television camera vidicons and liquid crystal displays.

Semiconductors oxides that have been utilized to form transparent conductive films include, for example, stannous oxide, indium oxide, cadmium oxide and the like which may be doped with antimony, indium, fluorine, and the like. One problem inherent in films prepared from these materials is that they have absorption edges in the near UV or in the blue end of the visible spectrum. Most electronic devices have poor blue response, and the absorption characteristics of such films aggravate the situation considerably. Where transmission at the blue end of the spectrum is critical, stannous oxide films are usually utilized because their absorption edge occurs further into the UV than other materials. Stannous oxide films, however, are disadvantageous in that their resistivity is higher than other semiconducting oxide films.

In many applications of transparent conductive films, transparency must be sacrificed to maximize conductivity and vice versa. An example of an application of transparent conductive films where conductivity is maximized at the expense of transparency is liquid crystal displays. In certain other applications, transparency and/or conductivity must be sacrificed for another critical property or properties such as, the necessity that deposition techniques be compatible with the intended substrate, etchability and the like.

SUMMARY OF THE INVENTION

In accordance with this invention, there are provided conductive transparent films of indium oxide and zirconium oxide having high conductivity and high optical transmission throughout the visible spectrum, particularly at the blue end. The latter property makes the subject films especially useful in the production of charge coupled imaging devices (CCD imaging devices) which are less efficient at shorter wavelengths. A method of annealing these films and an etchant therefor are also provided.

DETAILED DESCRIPTION OF THE INVENTION

The novel transparent conductive films of this invention are comprised of indium oxide ($In_2O_3$) and zirconium oxide ($ZrO_2$). The films are comprised of from about 40 to 60 percent by weight of each oxide with equal weight percents being preferred. The films may be formed by conventional techniques recognized by those of ordinary skill in the art such as reactive sputtering, DC sputtering, chemical vapor deposition and the like. The preferred method of preparing the subject films is rf sputtering. As utilized herein, the term "conductive" means a resistivity of less than $10^{-4}$ ohm cm.

The target for the preparation of the subject films by rf sputtering is prepared by conventional techniques. Preferably, the desired mixture of the two oxides in particulate form is mixed until homogeneous and hot pressed to form the target. The target should be pressed at high temperature, e.g. from about 250° to 700° C., to ensure both high density and high electrical conductivity. The target contains the respective oxides in the same proportion as the sputtered film.

The subject films are formed on a suitable substrate such as polysilicon, aluminum oxide or silicon dioxide. A suitable sputtering gas is a mixture of oxygen and argon in a partial pressure ratio of from about 50:50 to about 70:30, preferably about 60:40. The gas pressure is not particularly critical and is usually at about 10 microns of mercury.

Films deposited from the preferred target utilizing the preferred gas mixture and annealed in accordance with this invention have been shown to have a resistivity of about $4.5 \times 10^{-5}$ ohm-cm. This is lower than the best transparent conductive film reported in the literature by a factor of about ten. Although the subject films can be deposited to any thickness in accordance with conventional usage, generally, films having a thickness of from about 2000 to about 5000 angstroms, preferably about 3500 angstroms, are contemplated. This will vary depending on the intended use of the film.

Annealing of the subject films is carried out preferably in a reducing gas atmosphere at elevated temperatures. The preferred reducing gas is hydrogen, usually in combination with an inert gas such as nitrogen, argon and the like. A preferred reducing gas is forming gas which is a mixture of hydrogen and nitrogen. Forming gas conventionally is hydrogen and nitrogen in a 1:9 partial pressure ratio.

Annealing of the novel films of this invention is carried out at elevated temperatures, i.e. above about 700° C., preferably between about 700° and 850° C. While these temperatures are somewhat above annealing temperatures utilized for previously known transparent conductive films, it has been found, unexpectedly, that the resistivity of the subject films abruptly and significantly drops when heated above about 700° C. Annealing is carried out for from about 10 to 25 minutes, preferably for about 15 minutes.

As an example of the effect of annealing of the films of this invention, a film deposited from an equal mixture of indium oxide and zirconium oxide by rf sputtering utilizing a 60/40 partial pressure mixture of oxygen and argon had a sheet resistivity of $10^{11}$ ohms/sq. After annealing at 750° C. for 15 minutes in forming gas, the film had a sheet resistivity of 21 ohms/sq. This film showed no interference pattern, had an average transmission of about 80 percent, a reflection of about 1 percent and an absorption of about 19 percent.

Transparent conductive films such as provided herein are useful in an ever-increasing number and variety of applications such as transparent heaters, display devices, e.g. liquid crystal displays, infrared reflectors, thin film resistors and the like. A preferred application of the subject films is in CCD imaging devices. CCD imaging chips currently used in camera tubes are back-surface illuminated. This requires that the silicon wafer substrates of such chips be thinned, e.g. by chemical etching, to about 10 micrometers to reduce absorption by the substrate. This processing is costly and renders the chip fragile. A substantial savings in cost can therefore be realized by use of front surface illuminated CCD imaging devices. Such devices are provided according to this invention by replacing the conventional polysilicon top layer with the subject transparent conductive film.

The subject films are also highly conductive yet can be made semi-insulating in the spaces between electrically conducting channels. The methodology for making the subject films semi-insulating involves ion implantation and is described in our patent application Ser. No. 335,707, filed Dec. 30, 1981 and incorporated herein by reference. Front-illuminated CCD's incorporating the films of this invention are particularly useful in devices such as cameras.

In certain applications such as liquid crystal displays, it is necessary to etch the subject transparent conductive films. It has been found that a certain mixture is particularly effective in etching the subject films. In accordance with this invention, the subject films are etched with a mixture of concentrated hydrochloric acid, concentrated sulfuric acid and water in a ratio of 1:2:1. It is considered unexpected that this particular etchant is operative in view of the fact that neither concentrated sulfuric acid, recognized as an etchant for zirconium oxide films, nor concentrated hydrochloric acid, recognized as an etchant for tin-doped indium oxide films, is particularly effective in etching the subject films. In addition, combinations of these acids with other strong acids commonly used as etchants, for example, nitric acid or phosphoric acid, are likewise ineffective.

As utilized herein, the term "concentrated" with regard to the acids making up the etchants for the subject films refers to the conventional concentrations commercially available in the United States, i.e. 95.5 to 96.5 percent by volume for sulfuric acid and 37 percent by volume for hydrochloric acid. The etching of the subject films is carried out at elevated temperatures, i.e. from about 25° to about 95°, preferably about 70° Celsius. Under these conditions, the subject films will be etched at the rate of about 2,000 angstroms per minute. Etching may be carried out using either positive or negative resist materials to pattern the subject films. The choice of resist material is within the skill of the art depending on, e.g., the type of pattern desired. Generally, positive resists such as Shipley Chemical Co.'s AZ1350 are preferred.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

A target consisting of an equal weight percent mixture of indium oxide and zirconium oxide was prepared by thoroughly mixing the oxides in finely particulate form and hot pressing them at 300°.

The target was placed in a conventional rf sputtering apparatus. Utilizing a silicon dioxide coated silicon substrate, a transparent film was deposited at a rate of about 35 angstroms per minute in an atmosphere of, on a partial pressure basis, 60 percent oxygen and 40 percent argon. The total pressure in the apparatus was 10 microns of mercury. A 3500 angstroms thick semi-insulating film of high transparency was formed. The film had a resistivity of $10^{11}$ ohm-cm.

Samples of the above film, cast on quartz substrates, were found to have the following optical properties in the wavelength 400–800 nm.

Average Transmission 83 percent
Average Reflection 4.5 percent
Average Absorption 12.5 percent
More importantly, the film demonstrated no evidence of an absorption edge in the visible spectrum.

Annealing of the above films in forming gas, i.e. a 90:10 partial pressure mixture of nitrogen and hydrogen, at 750° for 15 minutes significantly reduced the resistivity. Using samples of film deposited in a 60:40 partial pressure mixture of oxygen and argon, the effect on sheet resistivity of various annealing temperatures was determined. In each instance, the sample of film, which had an initial sheet resistivity of $10^{11}$ ohms/sq., was held at the temperature for 15 minutes. The results are reported in Table I.

TABLE I

| Annealing Temperature | Sheet Resistivity (ohm/sq.) |
|---|---|
| 400° | $10^{10}$ |
| 450° | $10^{10}$ |
| 500° | $2 \times 10^4$ |
| 550° | $1.4 \times 10^4$ |
| 600° | $1.9 \times 10^4$ |
| 650° | $1.9 \times 10^4$ |
| 700° | $1.9 \times 10^4$ |
| 750° | 21 |

The sharp decrease in resistivity in the range 700°–750° is clearly demonstrated by the above results.

The effect of variances in the rf sputtering gas mixture on the resistivity of films formed from a target containing equal parts indium oxide and zirconium oxide with all other conditions being the same is shown in Table II. Annealing in each instance was carried out at 750° for 15 minutes in forming gas.

TABLE II

| Sputtering Mixture Oxygen/Argon | Resistivity (ohm-cm) Initial | Annealed |
|---|---|---|
| 100/0 | $3.9 \times 10^{10}$ | $8.4 \times 10^{-3}$ |
| 90/10 | $5 \times 10^9$ | $4.4 \times 10^{-4}$ |
| 80/20 | $5.6 \times 10^8$ | $4.4 \times 10^{-4}$ |
| 70/30 | $1.5 \times 10^9$ | $6.1 \times 10^{-4}$ |
| 60/40 | $1.9 \times 10^6$ | $4.4 \times 10^{-4}$ |

The significant decrease in resistivity caused by annealing the films is evident from the data in Table II.

EXAMPLE 2

Samples of films formed in accordance with the method of Example 1 were coated with the Shipley Co. positive photoresist AZ1350. The photoresist was irradiated through a pattern mask and developed in accordance with the manufacturer's specifications.

A series of etching solutions containing common strong mineral acids was prepared and tested to determine their capacity to etch the $In_2O_3$-$ZrO_2$ film. In each instance, 20 ml of etchant was prepared and the sample immersed therein. The results are reported in Table III. Commercial concentrated acids were used in each instance.

TABLE III

| Etchant | Result |
|---|---|
| Hydrogen Peroxide/Nitric Acid/ Sulfuric Acid, Volume to volume ratio 1:1:1 | No effect |
| Hydrochloric Acid/Nitric Acid, Volume to volume ratio 1:1 | No effect |
| Phosphoric Acid at 175° | No effect |
| Phosphoric Acid/Hydrochloric Acid, Volume to volume ratio | No effect |

TABLE III-continued

| Etchant | Result |
|---|---|
| 1:1, at 100° Hydrochloric Acid/water, volume to volume ratio 1:1 containing, in each 20 ml, 10g. of potassium chromate monohydrate, | No effect |
| Nitric Acid/49 percent by weight aqueous solution of hydrogen fluoride, Volume to volume ratio 1:1 | Etched-but attacked substrate |
| Hydrochloric Acid/Sulfuric Acid/Water, Volume to volume ratio 1:2:1 at 70° | Cleanly etched film-did not attack substrate |

Additional testing with the preferred etchant showed that, although 70° is optimum, the temperature could vary from 25° to as high as 95°.

We claim:

1. An article comprising a transparent conductive film comprised of indium oxide and zirconium oxide on a suitable substrate.

2. An article in accordance with claim 1, wherein the film is comprised of from about 40 percent to about 60 percent by weight of indium oxide and from about 40 percent to about 60 percent by weight of zirconium oxide.

* * * * *